US006759351B2

(12) United States Patent
Boulenger (10) Patent No.: US 6,759,351 B2
(45) Date of Patent: Jul. 6, 2004

(54) METHOD FOR ELIMINATING DEVELOPMENT RELATED DEFECTS IN PHOTORESIST MASKS

(75) Inventor: Caroline Boulenger, La Ferte Alais (FR)

(73) Assignee: International Business Machines Corporation, Armonk, NY (US)

(*) Notice: Subject to any disclaimer, the term of this patent is extended or adjusted under 35 U.S.C. 154(b) by 103 days.

(21) Appl. No.: 09/756,997

(22) Filed: Jan. 8, 2001

(65) Prior Publication Data

US 2001/0023972 A1 Sep. 27, 2001

(30) Foreign Application Priority Data

Jan. 11, 2000 (FR) .......................................... 00 480017

(51) Int. Cl.[7] .............................................. H01L 21/00
(52) U.S. Cl. ...................... 438/906; 438/942; 438/945; 438/949
(58) Field of Search ................................ 438/906, 942, 438/945, 948, 949, 725, 12, 780, 781, 789, 790, 793; 257/642

(56) References Cited

U.S. PATENT DOCUMENTS

| | | | | |
|---|---|---|---|---|
| 4,736,760 A | * | 4/1988 | Coberly et al. | |
| 5,268,260 A | * | 12/1993 | Bantu et al. | 430/325 |
| 5,793,158 A | * | 8/1998 | Wedding | 313/493 |
| 5,861,064 A | * | 1/1999 | Oikari et al. | 134/26 |
| 5,983,907 A | * | 11/1999 | Danh et al. | 438/906 |
| 6,372,408 B1 | * | 4/2002 | Lu et al. | 430/296 |
| 6,387,822 B1 | * | 5/2002 | Murphy et al. | 438/745 |

FOREIGN PATENT DOCUMENTS

| | | |
|---|---|---|
| JP | 61-098347 | 5/1986 |
| JP | 06-196397 | 7/1994 |

* cited by examiner

*Primary Examiner*—Amir Zarabian
*Assistant Examiner*—Christy Novacek (57) ABSTRACT

Polymer blobs that are development related defects are substantially eliminated in patterned photoresist masks by a heat treatment of the wafer performed at a development step in two different manners according to the present invention. In the first method, after the development has been performed as standard, the wafer is heated at 140° C. and before cooling takes place, it is rinsed with deionized water (DIW) at room temperature. In the second method, the wafer is either developed as standard but rinsed with 60° C. DIW instead of 22° C. DIW, or, after standard development, it is submitted to an extra rinse step with 60° C. DIW.

1 Claim, 7 Drawing Sheets

ARRAY
FIG. 1C  PRIOR ART

ARRAY
FIG. 1D  PRIOR ART

METHOD FOR ELIMINATING DEVELOPMENT RELATED DEFECTS IN PHOTORESIST MASKS

FIELD OF THE INVENTION

The present invention relates to the manufacture of semiconductor integrated circuits (ICs) and more particularly to a method for eliminating development related defects referred as polymer blobs in photoresist masks at the end of the photolithography process.

BACKGROUND OF THE INVENTION

In the manufacture of semiconductor integrated circuits such as Dynamic Random Access Memory (DRAM) chips, polysilicon borderless contacts, referred to hereinbelow as the CB contacts, are extensively used to connect devices to the first level of metallurgy (M0), for instance, to interconnect the source regions and the gate conductors of the Insulated Gate Field Effect Transistors (IGFETs). In conventional DRAM chips, each elementary memory cell is comprised of an IGFET and its associated capacitor that is formed in a deep trench.

The essential steps of a conventional CB contact hole formation process will be briefly described by reference to FIGS. 1A–1D. After these steps have been completed, the CB contact holes are formed and then filled with a conductive material to create the so-called CB contacts.

Figure 1A:
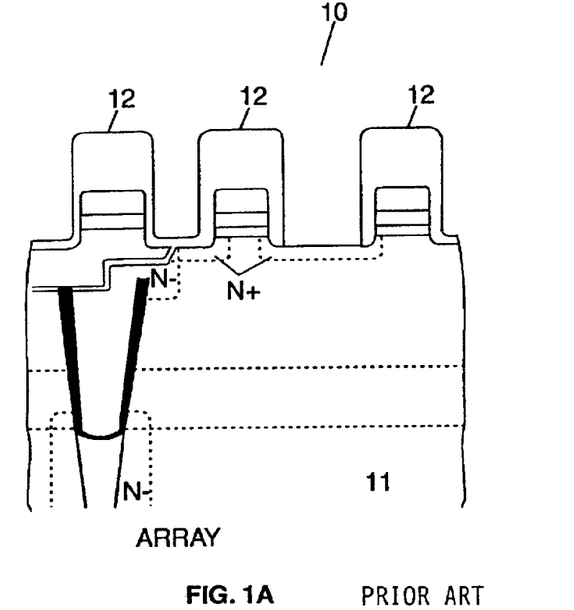
FIGS. 1A–1D show cross-sections of a semiconductor structure undergoing the essential steps of a conventional CB contact hole formation process.

FIG. 1A schematically illustrates a state-of-the-art semiconductor structure 10 which is part of a wafer at the initial stage of the CB contact hole formation process. Structure 10 comprises a silicon substrate 11 with diffused regions formed therein and a plurality of gate conductor stacks 12 formed thereon. A gate conductor stack consists of a composite $SiO_2$/doped polysilicon/tungsten silicide structure.

Figure 1B:
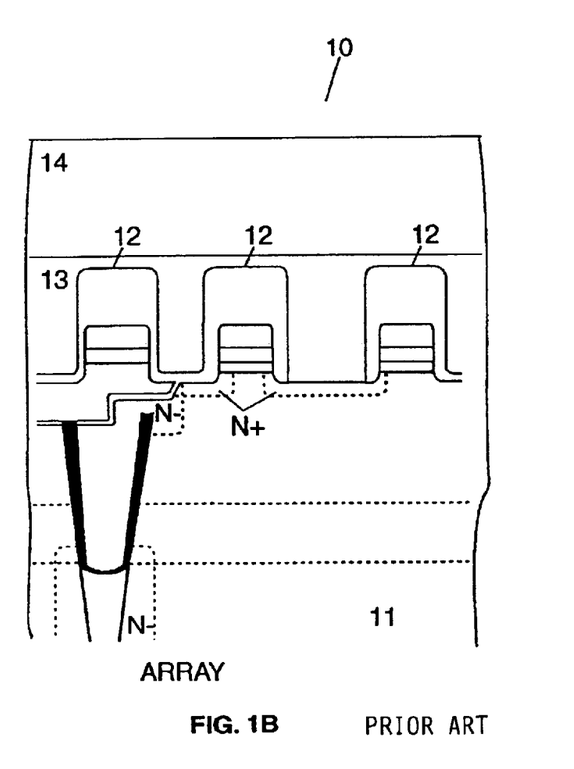

Referring to FIG. 1B, structure 10 is coated with a boro-phospho-silicate-glass (BPSG) layer 13 and a tetraethyl-ortho-silicate (TEOS) oxide layer 14 above it. These layers are conformally deposited onto structure 10 by LPCVD as standard. As apparent in FIG. 1B, structure 10 has a substantially planar surface.

Now, CB contact holes are formed, using a common deep UV (DUV) photolithography process. To that end, the wafer is placed in an equipment comprised of a clean track system and a DUV exposure tool allowing a fully clusterized operation. For instance, the clean track system is an ACT8 tool manufactured by TEL (Tokyo Electron Limited), Tokyo, Japan and the DUV exposure tool is a Micrascan 3 scanner manufactured by SVG (Silicon Valley Group), Wilton, Conn., USA.

Figure 1C:
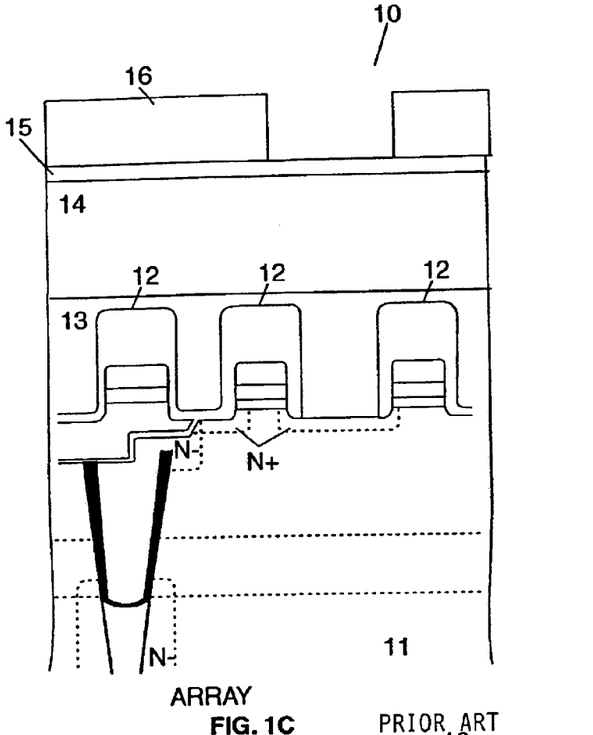

Turning to FIG. 1C, structure 10 is coated first with a 90 nm thick organic Bottom Anti-Reflective Coating (BARC) layer 15 then with a 625 nm thick layer 16 of a DUV photoresist material. After deposition, the photoresist layer 16 is baked, exposed, baked again, then developed as standard to leave a patterned layer referred to hereinbelow as the CB mask still referenced 16 for the sake of simplicity. The purpose of this CB mask 16 is to define the locations of the CB contacts at the first level of metallurgy (M0).

The BARC material supplied by SHIPLEY USA, Malborough, Mass., USA under reference AR3 900 and DUV photoresists such as KrF M20G supplied by JSR Electronics Co, Yokkaichi, Japan or UV80 supplied by SHIPLEY USA are adequate in all respects. The essential process parameters of the different steps to which the wafers are submitted during the photoresist development process are given below. All these steps are conducted in the ACT8 tool.

1. BARC layer: after coating, bake at 225° C. during 60 sec, then cool down to 22° C. for 60 sec.
2. Resist layer: after coating, post apply bake (PAB) at 140° C. during 90 sec, then cool down to 22° C. for 60 sec.
3. Post exposure bake (PEB): bake at 140° C. during 90 sec followed by cooling at 22° C. for 60 sec.
4. Development: conducted in four sub-steps using surfacted TMAH 0,263N that is dispensed with the H nozzle at 22° C.:
   a) developer puddle formation with a 50 sec wait;
   b) developer refresh (PDD: post development dispense);
   c) rinse with 22° C. deionized water (DIW); and,
   d) dry by spin rotation.

Figure 1D:
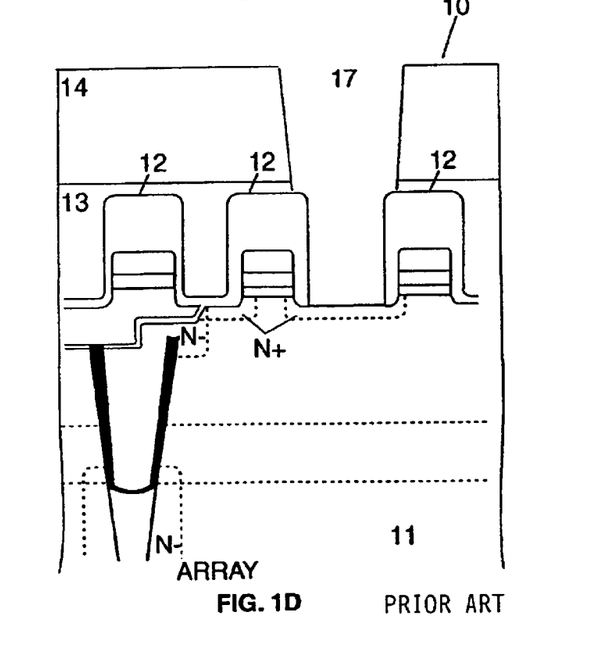

After the CB mask 16 has been defined, the process continues with the etching of layers 13 and 14 at locations not protected by said CB mask 16 to create CB contact holes 17. At this final stage of the CB contact hole formation process, the resulting structure is shown in FIG. 1D. Now the CB contacts are fabricated. A doped polysilicon layer is conformally deposited onto structure 10 to fill CB contact hole 17 in excess. Next, the doped polysilicon is etched in a plasma until the TEOS layer 14 surface is reached, and the etching is continued to produce a recess (CB recess) in the polysilicon fill that will be subsequently filled with metal to produce the desired M0 metal lands for the word lines.

To control the defects or contamination added by the photolithography process itself, it is common to inspect patterned monitor wafers using a defect inspection equipment such as the TENCOR AIT, a tool manufactured by KLA-TENCOR, San Jose, Calif., USA, right after the end of the photolithography process. Total or partial wafer surface can be inspected resulting in a defect density measured by the number of defects/$cm^2$. A map of the defects is generated. The defects can then be viewed using an optical microscope with laser imaging to analyze the size and shape of the defects in an attempt to determine the root cause. Bare silicon monitor wafers patterned with the CB mask 16 are used to control the defect level of the above described CB contact hole formation process.

The step of creating the CB mask 16 in DRAM chips is essential to the whole chip fabrication process, CB contact holes not etched can lead to the rejection of the chip. This step is normally a clean process which leads to a defect free photoresist CB mask 16. More generally, less than 15 defects/wafer in the array area has been an acceptable level in the photolithography process for current technologies so far. Unfortunately, the total defect density at the CB mask level has been increasing with the introduction of a new generation of DUV photoresists in the manufacturing lines for unknown reasons.

Recent advances in high resolution DUV photoresists incorporating ESCAP (Environmental Safe Chemically Amplified Photoresist) chemistries have allowed to extend the life of a number of technologies in DUV photolithography beyond 0.20 μm. A side effect of this improved resolution for certain photoresists is the appearance of defects of a new kind that can be widely found in several high resolution DUW photoresists that are commercialized by different vendors on the market to date. These defects, known under the name of "polymer blob defects" because they are "blob" shaped, are seen right after development and can also be qualified as post development residues. Most of the time, they are seen in large unexposed parts of the photoresist layer in the "support/kerf" area but they are also present in the "array" area. If we still consider the CB contact hole formation process described above, the blobs can be redeposited over openings of the CB mask 16 preventing the contact hole formation during the etch step. Blobs are very critical defects as they have a real impact on test yields. The big concern for photoresist users and manufacturers is that as DUV photoresist systems evolve to even higher resolution, polymer blobs will soon become a major yield detractor.

Figure 2A:
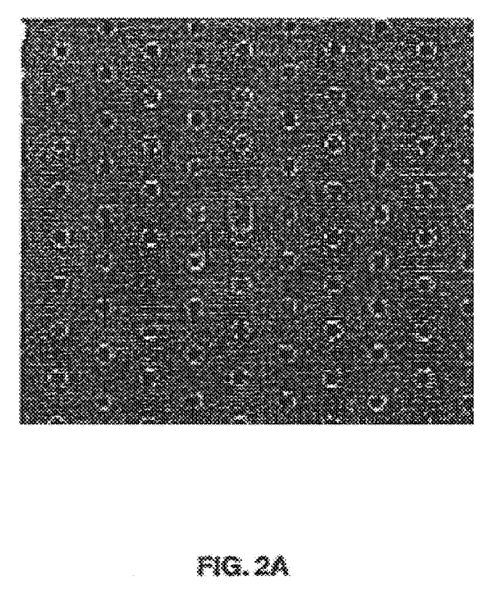
FIG. 2A is a SEM photograph of a so-called small polymer blob defect.
Figure 2B:
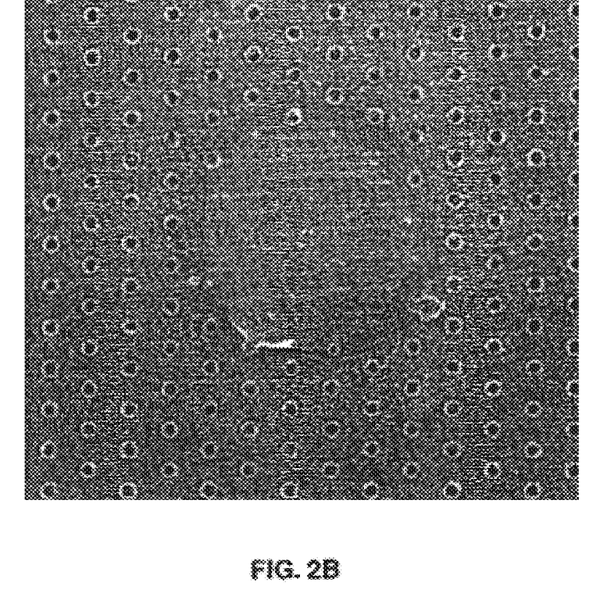
FIGS. 2B and 2C are SEM photographs of a so-called large polymer blob defects located in the "array" and "support/kerf" areas respectively.
Figure 2C:
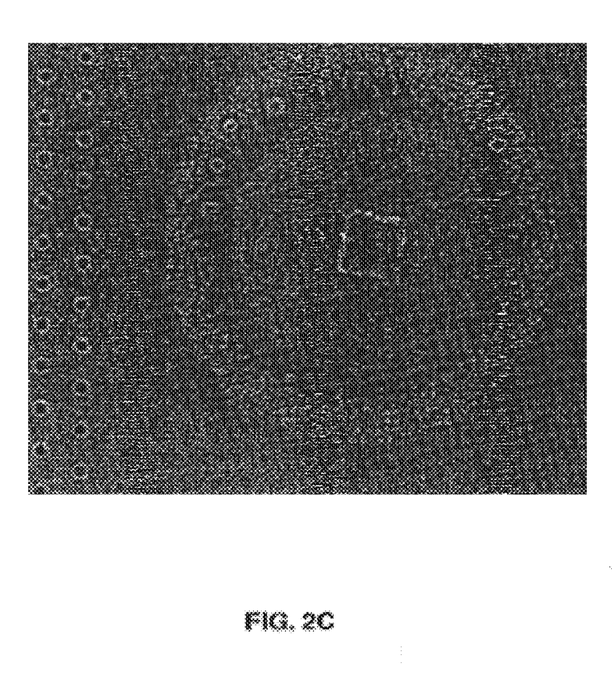
Figure 3:
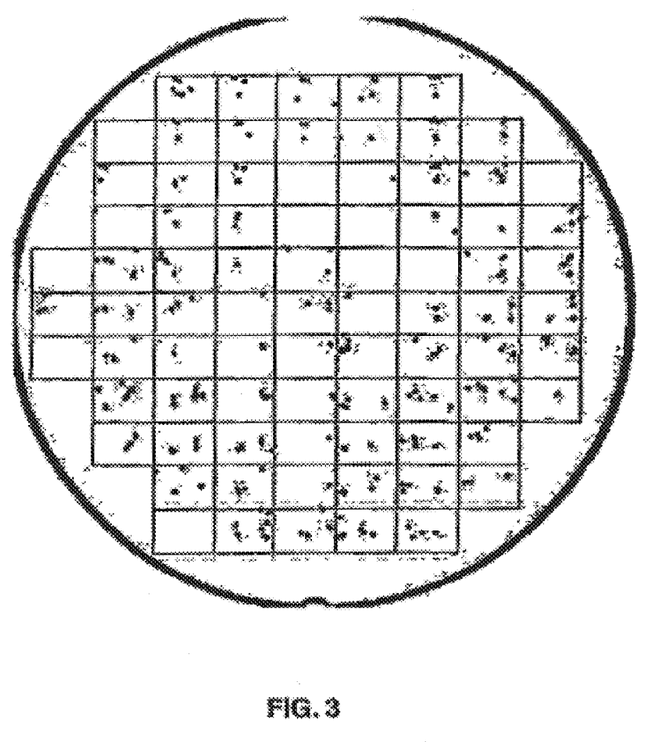
FIG. 3 is a map representing the total defects (i.e. non-blob related and blob defects) at the surface of an inspected wafer.

The polymer blobs can vary in size from approximately 1 $\mu$m (referred to as small blobs) up to 20 $\mu$m or even more (referred to as large blobs). Typical small and large blobs are shown in FIGS. 2A, 2B and 2C respectively. As apparent in FIG. 2A, the small blob located at the center of the photograph covers two CB contact holes and there are some polymer residues over the surrounding CB contact holes. FIGS. 2B and 2C show a typical large blob in the "array" and "support/kerf" areas respectively. Large blobs often have a donut-like shape with an inside circle. A large polymer blob is able to cover a great number of CB contact holes and in that regards, can be considered as a manufacturing yield killer. SEM analysis shows a 10 nm thick circular structure surrounded by little spots. Chemical analysis have shown the presence of traces of metals such as Ca, Na, K and Mg. Blobs are easily seen with a simple optical microscope under dark field during post-development inspection. They exhibit a definite signature in that they form clusters which look like water trails or shiny stars. Although they were originally seen, by hundreds, in the "support/kerf" areas of the CB mask 16, typical defect density in the "array" area is approximately 3.5–4 blobs/cm$^2$ but can go up to 6 defects/cm$^2$ (i.e. 500 defects/wafer). FIG. 3 shows a map of the total defects for an inspected wafer. By total defects, we consider non-blob related and blob defects.

Figure 4:
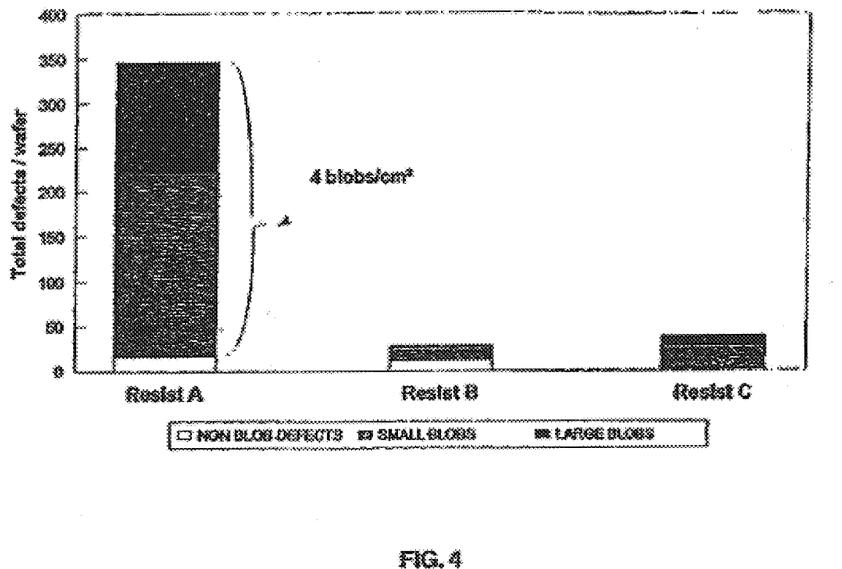
FIG. 4 is a chart depicting the average number of total defects for several wafers processed with different photoresists A, B and C.

FIG. 4 shows the average number of total defects for three different resists labeled A, B and C that were used at the CB mask level of the conventional CB hole formation process described above by reference to FIGS. 1A–1D. As apparent in FIG. 4, the blob density is equal to about 4 defects/cm$^2$ for resist A. For all experiments, the wafers were inspected with the TENCOR AIT. A complete review was then done which allowed to separate non-blob related defects from small and large blob defects. Polymer blobs are a major concern at the CB contact hole formation level but they have also been identified at other masking levels, particularly at contact-like openings and appear to be very dependent on pattern density. Note that, they also appear on line-space patterns but in a much smaller extent.

Extensive works have been done so far to eliminate polymer blob defects by incorporating process-specific solutions. On the other hand, photoresist vendors are working hard on new formulations. Proposed fixes, which are usual known fixes in the photolithography process, include lowering PAB and PEB temperatures, optimizing development or DIW rinse cycle, adding delays between exposure and PEB, increasing exhaust in the developer module, slightly increasing developer temperature, etc. All these fixes reduce the amount of defects, some just a few, others a little bit more, and when combined together (at the cost of an obvious increased process complexity), the defect level decreases dramatically to 1 blob/cm$^2$, i.e. an 75% improvement, but none combination of fixes has been identified so far that would totally eliminate the blob defects. An acceptable fix would be to have a 95% defect elimination which would represent a defect density of about 0.2 blob/cm$^2$, although the goal would be to reach the 100% total elimination.

SUMMARY OF THE INVENTION

It is therefore a primary object of the present invention to provide an efficient method to totally eliminate development related defects called polymer blobs in patterned photoresist masks.

It is still another object of the present invention to provide an efficient method to totally eliminate development related defects called polymer blobs in patterned photoresist masks that improves manufacturing yields by a significant decrease of the chip rejection rate.

It is another object of the present invention to provide an efficient method to totally eliminate development related defects called polymer blobs in patterned photoresist masks at the CB contact hole formation level in DRAM chips.

The accomplishment of these objects and other related objects is achieved by the two methods of the present invention which in substance rely on a heat treatment of the wafer during or after the development step. In the first method, after the standard development step has been carried out, the wafer is heated (e.g. at 140° C.) by performing a post development bake (PDB) without cooling that is immediately followed by an extra rinse with deionized water (DIW) at room temperature (22° C.). In the second method, the wafer is rinsed with hot deionized water (e.g. at 60° C.) either in an extra rinse step after the development has been performed or during the development step as a replacement of the standard 22° C. DIW rinse.

The above methods are applicable to any photolithography process whatever the type (MUV/DUV) of masks used and the type of photoresists and lead to a significant improvement of the blob defect density in the patterned photoresist masks.

The novel features believed to be characteristic of this invention are set forth in the appended claims. The invention itself, however, as well as these and other related objects and advantages thereof, will be best understood by reference to the following detailed description to be read in conjunction with the accompanying drawings.

DESCRIPTION OF THE PREFERRED EMBODIMENTS

As known for those skilled in the art, the standard in the semiconductor industry to date as far as the photolithography process is concerned, is to perform all the operating steps thereof at room temperature, i.e. between 21 and 23° C. except for the bake steps of course. In particular, all the materials that are involved in the photolithography process; photoresist, developer, DI water and the like are used at room temperature. The inventor significantly departing from that well-established opinion has discovered that a heat treatment of the wafer performed at the development step, i.e. when the patterned photoresist mask has been formed, dramatically reduces the blob defects. According to the present invention, this heat treatment of the wafer can be conducted in two different manners. In the first method, after the development has been performed as standard, the wafer is heated and before cooling takes place as usually done, it is rinsed with DIW at room temperature (22° C.) or at a higher temperature as well. In the second method, the wafer is either submitted to an extra rinse step with hot DIW after standard development or developed as standard but is rinsed with hot DIW instead of 22° C. DIW. Detailed operating conditions based upon the various experiments conducted by the inventor will now be described.

First Method: Heated Wafer Rinsed with 22° C. DIW

The standard development process (labeled 4) described above in the prior section is performed without change. At the end of this step which is performed in one developer module of the ACT8 tool, the wafer is removed and placed first in the hot plate module, then in another developer module. It is submitted to two additional steps according to the following operating conditions given below:

5. Post-development bake (PDB): place the wafer in a low oven proximity hot plate module of the ACT8 tool to heat the wafer at 140° C. during 60 sec (this post development bake step is sometimes performed to stabilize and harden the photoresist mask for the next etching steps).
6. Extra DIW rinse: directly place the heated wafer in the developer module of the ACT8 tool without cooling and perform an extra rinse with 22° C. DIW (or higher).

Figure 5:
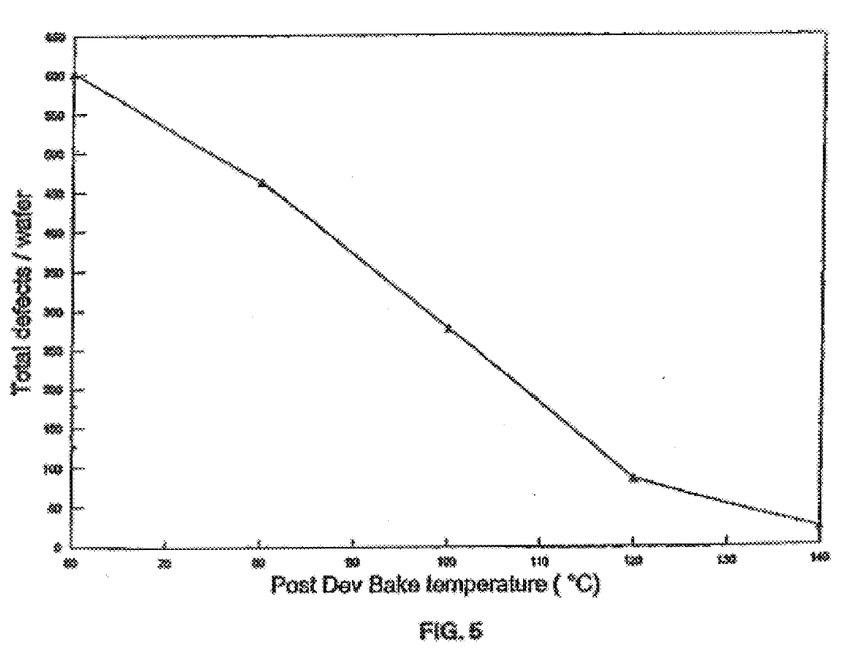
FIG. 5 is a graph showing the influence of the post development bake temperature on the number of total defects per wafer which supports the first method of the present invention.

It is a key parameter that there is a minimum delay between the post development bake and the extra DIW rinse steps because the wafer must still be hot when entering in the developer module for rinse. The inventor has conducted various experiments showing the influence of the PDB temperature on polymer blob defect density. Temperatures ranging from 60° C. to 140° C. were tested. FIG. 5 shows a continuous decrease of the amount of total defects as the temperature increases. Optimum results were obtained at 140° C. which was chosen to be the maximum allowed temperature as it is not recommended for the subsequent steps of the chip fabrication process to go beyond the PAB and PEB temperatures of the photoresist.

Figure 6:
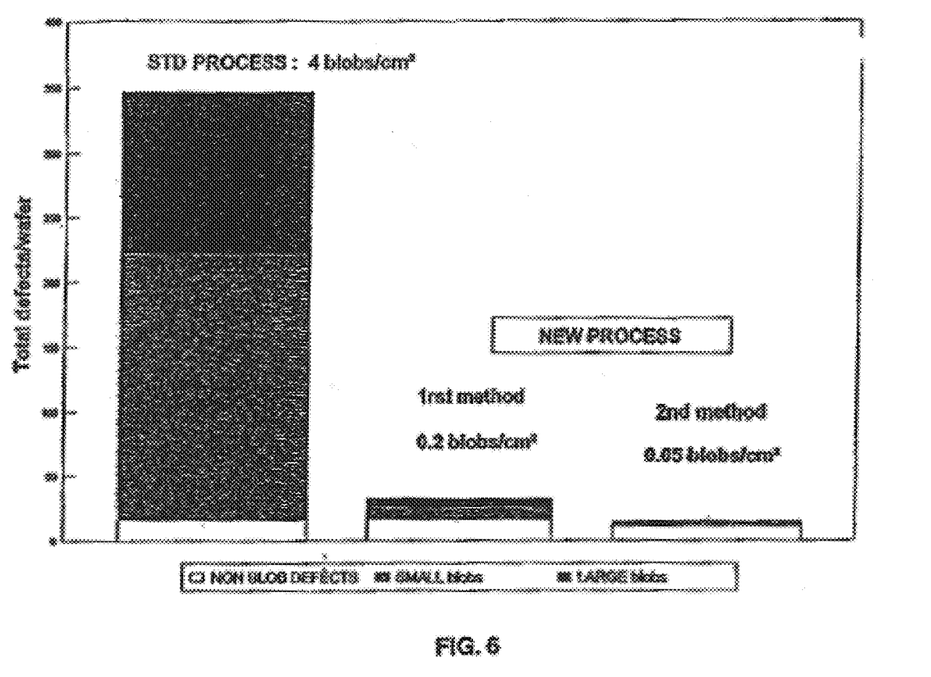
FIG. 6 is a chart showing the drastic reduction of the number of total defects measured per wafer when the two methods of the present invention are used with respect to the standard development process.

FIG. 6 shows the defect reduction with this first method when using resist A with a large number of wafers on different equipments for result averaging. As apparent in FIG. 6, the polymer blob density has been lowered from 4 blobs/cm$^2$ with the standard development process down to 0.2 blobs/cm$^2$ when the first method described above has been implemented. The majority of the wafers had zero blobs, only a few showed small and large blobs (large blobs were in a very small amount).

The advantage of this first method is that, aside it allows to reduce the blob density to an acceptable level, there is no hardware investment or equipment upgrade.

Second Method: Hot DIW Rinse

The inventor made the assumption that the temperature of the DIW for the rinse step could also be an important factor which would directly affect the number of polymer blob defects. Experiments were thus conducted to show the influence of the DIW temperature on the number of these defects.

An adequate water heating device is a module manufactured by EBERLE Cy, Courtry 77, France, which is placed on top of the ACT8 tool, just above the developer modules to avoid temperature loss. This device consists of a quartz heating element installed along the DIW supply line of the ACT8 tool. A heating resistance heats the water in a tank to the desired temperature. The DIW of the ACT8 tool is deviated to go through the quartz tubing emerged in the tank. Water is heated with a safety interlock and only when requested, to avoid hot water stagnation in the pipes which could generate bacteria. It is important to program sufficient dummy dispense just prior to the rinse process of the wafer so that the temperature of the water is reached by the time it is needed to be poured on the wafer.

Figure 7:
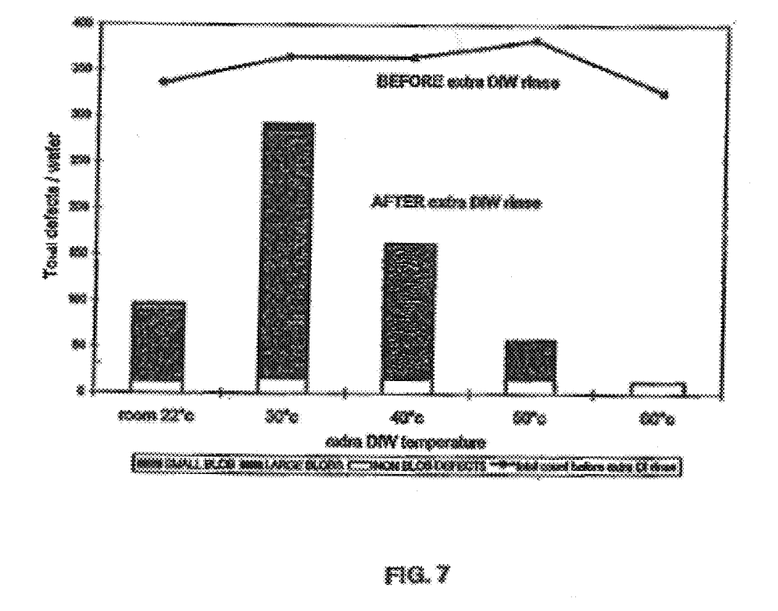
FIG. 7(a) shows the number of total defects for five groups of wafers before an extra DIW rinse is performed and FIG. 7(b) shows the number of total defects on the same groups of wafers after an extra DIW rinse is performed with DIW at five different temperatures (the distribution of the defects depending upon their type is also depicted).

FIG. 7(a) shows the number of total defects measured for five groups of wafers after a standard development when using resist A. This number varies between about 350 and 400 total defects/wafer. In this case, no extra rinse step is performed. Now, the five groups of wafers are submitted to an extra rinse with DIW at five different temperatures ranging from 22° C. to 60° C. FIG. 7(b) shows a significant decrease of the number of total defects (and therefore the number of polymer blobs) when an extra rinse is performed after the development process. The optimum results were obtained with DIW at a temperature of 60° C. for which all the polymer blobs were eliminated. Note that surprisingly, at temperatures just above 22° C., i.e. up to 40° C., the hot DIW effect was not favorable for unknown reasons. Experiments were limited to 60° C. because the ACT8 tool pipes does not withstand greater temperatures.

There are two ways to run the second method. A first alternative is to run the standard development process, then add an extra rinse step with DIW at a determined hot temperature. Second alternative consists to directly replace the 22° C. DIW rinse (see 4.c above) by a hot DIW rinse. Experiments conducted by the inventor showed that DIW at a temperature of 60° C. is appropriate in both cases.

Let us consider again the CB contact hole formation process described above by reference to FIGS. 1A–1D, the photolithography process is conducted as standard till the development step (labeled 4). Then, new process steps are performed according to the present invention as described below.

First Alternative:

4'. Development:
  a) as above in step 4
  b) as above in step 4 c) as above in step 4 d) as above in step 4 e) extra rinse with 60° C. DIW.

Second Alternative:

4". Development:

a) as above in step 4 b) as above in step 4 c") replace 22° C. DIW rinse by a 60° C. DIW rinse.

d) as above in step 4

In this case, all the development sub-steps are performed in the same developer module.

The first alternative which separates the hot DIW rinse from the development cycle is preferred for hardware and process reasons. Both alternatives did not show any impact on process window (dose and focus latitude which enable to keep the critical dimension in specification within tolerance). However, one can imagine that a hot DIW integrated immediately after the end of developer puddle formation sub-step in the development process may have more side effects on pattern than a separate hot DIW rinse, done once the pattern has been defined. The first alternative requires to have a specific module to do the hot DIW rinse or a second DIW supply line inside the developer module itself. In the latter case, a first line transports the 22° C. DIW and a second line transports the 60° C. DIW. This way, the hot DIW rinse step can be programmed within the developer recipe, after the 22° C. DIW rinse step.

Figure 8:
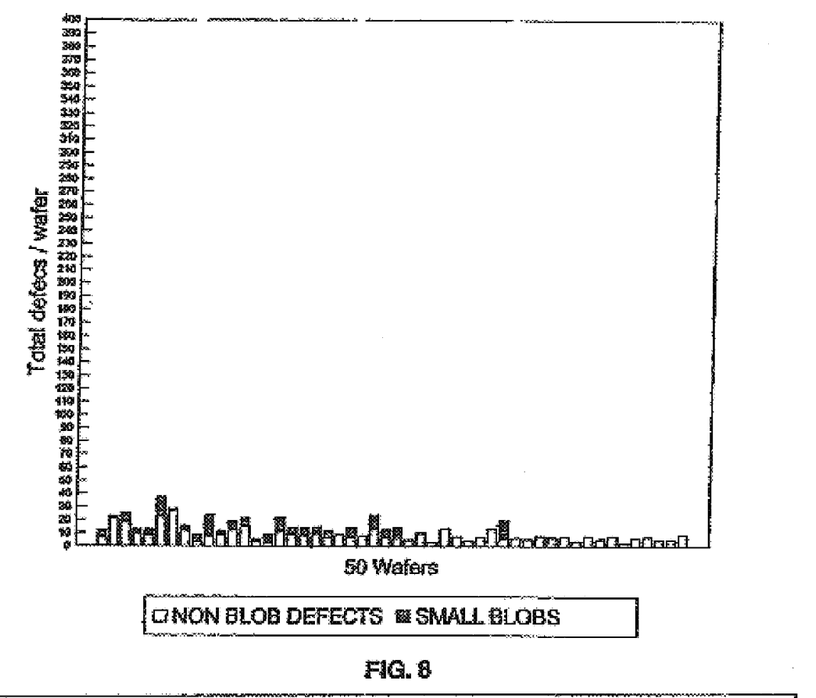
FIG. 8 is a chart showing the distribution of total defects for 50 wafers showing the complete elimination of the large blob defects and the drastic reduction of the small blob defects when the second method of the present invention is used with resist A.

Both alternatives of this second method give equivalent results in terms of total defect reduction. FIG. 6 allows a full comparison between the standard development process and the two methods of the present invention. As apparent in FIG. 6, with the second method (hot DIW rinse), 99% of the large polymer blobs are eliminated and the blob density now is as low as 0.05 blob/cm². FIG. 8 demonstrates the repeatability of the second method on a great number (50) of wafers. Obviously the second method offers greater advantages than the first method which only has a 95% improvement. Moreover, the first alternative of the second method still remains efficient even with a delay as long as 2 weeks between the end of the development and the hot DIW rinse of sub-step e). Such delays are usually not favorable to eliminate post development defects which tend to stick more to the wafer surface as time goes by. This demonstrates how efficient hot DIW water is on large/small polymer blob defect elimination.

Figure 9:
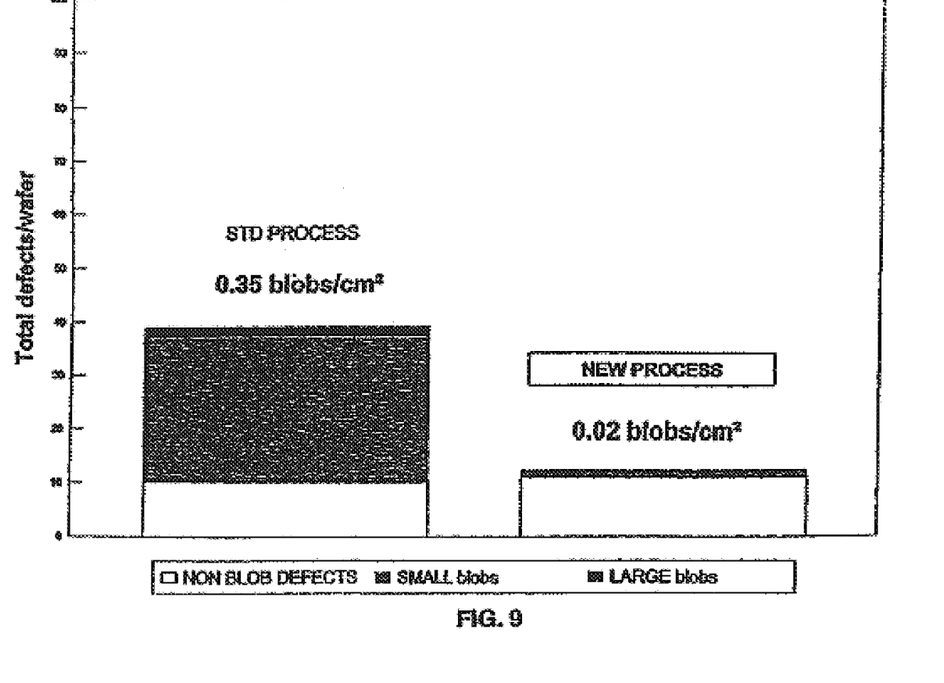
FIG. 9 is a chart showing the reduction of the number of total defects due to the total elimination of the large blobs and the drastic reduction of the small blob defects when the second method of the present invention is used with resist B.

FIG. 9 shows the effect of hot DIW rinse on resist B which was initially formulated by the vendor to be "blob free". As apparent in FIG. 9, a small number of small and large blob defects, about 0.35 blobs/cm², was found on this resist. After hot DIW rinse, substantially all the polymer blobs were eliminated as the number was reduced to about 0.02 blobs/cm². In addition, FIG. 9 illustrates the total elimination of the large polymer blobs when hot DIW rinse is used.

Final test yield results were obtained on split lots with this second resist B at CB mask level using the hot DIW rinse process with the first alternative vs the standard development process. Wafers that were processed with hot DIW showed a slight yield improvement mainly because the number of polymer blobs for this resist in a standard development process was not high enough to impact yield. However, the results clearly show that hot DIW rinse does not degrade yield and chip performance. The benefit of this process can be seen when a photoresist with a high level of small and large blob defects such as photoresist A is used in a manufacturing mode in association with a mask which pattern type and density are favorable to the formation of polymer blobs.

While the invention has been particularly described with respect to preferred embodiments thereof, it should be understood by one skilled in the art that the foregoing and other changes in form and details may be made therein without departing from the spirit and scope of the invention. In particular, the methods of the present invention do not only apply to DRAM chips but also to logic chips as well with even greater impact because as known for those skilled in the art, logic chips have no redundancy cells so that they are more sensitive to contact hole fails.

What is claimed is:

1. A method for eliminating polymer blobs in a photoresist mask formed at the surface of a semiconductor wafer, comprising the steps of:

providing a semiconductor wafer having a photoresist layer formed thereon;

exposing, baking and developing the photoresist layer to produce a patterned photoresist mask; and heating the wafer for a time sufficient to reach a temperature in a 100–400° C. range and without cooling it, and then rinsing the wafer with deionized water at a temperature equal to or higher than the room temperature; wherein the semiconductor wafer comprises silicon, said step of heating the silicon wafer includes a step of post-development bake performed after said development step, the silicon wafer is immediately rinsed after said bake step, and the bake temperature is about 140° C.

* * * * *